United States Patent
Ogle, Jr. et al.

(10) Patent No.: US 6,798,002 B1
(45) Date of Patent: Sep. 28, 2004

(54) DUAL-PURPOSE ANTI-REFLECTIVE COATING AND SPACER FOR FLASH MEMORY AND OTHER DUAL GATE TECHNOLOGIES AND METHOD OF FORMING

(75) Inventors: Robert B. Ogle, Jr., San Jose, CA (US); Tuan D. Pham, San Jose, CA (US); Mark T. Ramsbey, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/607,675

(22) Filed: Jun. 30, 2000

Related U.S. Application Data

(60) Provisional application No. 60/159,235, filed on Oct. 13, 1999.

(51) Int. Cl.[7] .................. H01L 27/108; H01L 29/76; H01L 29/94; H01L 31/119
(52) U.S. Cl. ........................... 257/295; 257/306
(58) Field of Search .................... 257/295–310, 257/314–324; 438/3, 241–254, 257–265

(56) References Cited

U.S. PATENT DOCUMENTS

| | | | | |
|---|---|---|---|---|
| 6,027,971 A | * | 2/2000 | Cho et al. | 438/257 |
| 6,133,096 A | * | 10/2000 | Su et al. | 438/264 |
| 6,559,494 B1 | * | 5/2003 | Taniguchi | 257/306 |

* cited by examiner

Primary Examiner—Cuong Nguyen
(74) Attorney, Agent, or Firm—Farjami & Farjami LLP

(57) ABSTRACT

A dual gate semiconductor device, such as a flash memory semiconductor device, whose plurality of dual gate sidewall spacer structure is formed by a first and second anti-reflection fabrication process. The sidewall spacers of the dual transistor gate structures in the core memory region are left coated with the second anti-reflective coating material, after being used for gate patterning, to act as sidewall spacers for use in subsequent ion implant and salicidation fabrication steps. The second anti-reflective coating material is selected from a material group such as silicon oxynitride (SiON), silicon nitride ($Si_3N_4$), and silicon germanium (SiGe), or other anti-reflective coating material having optical properties and that are compatible with the subsequent implant and salicidation steps.

8 Claims, 6 Drawing Sheets

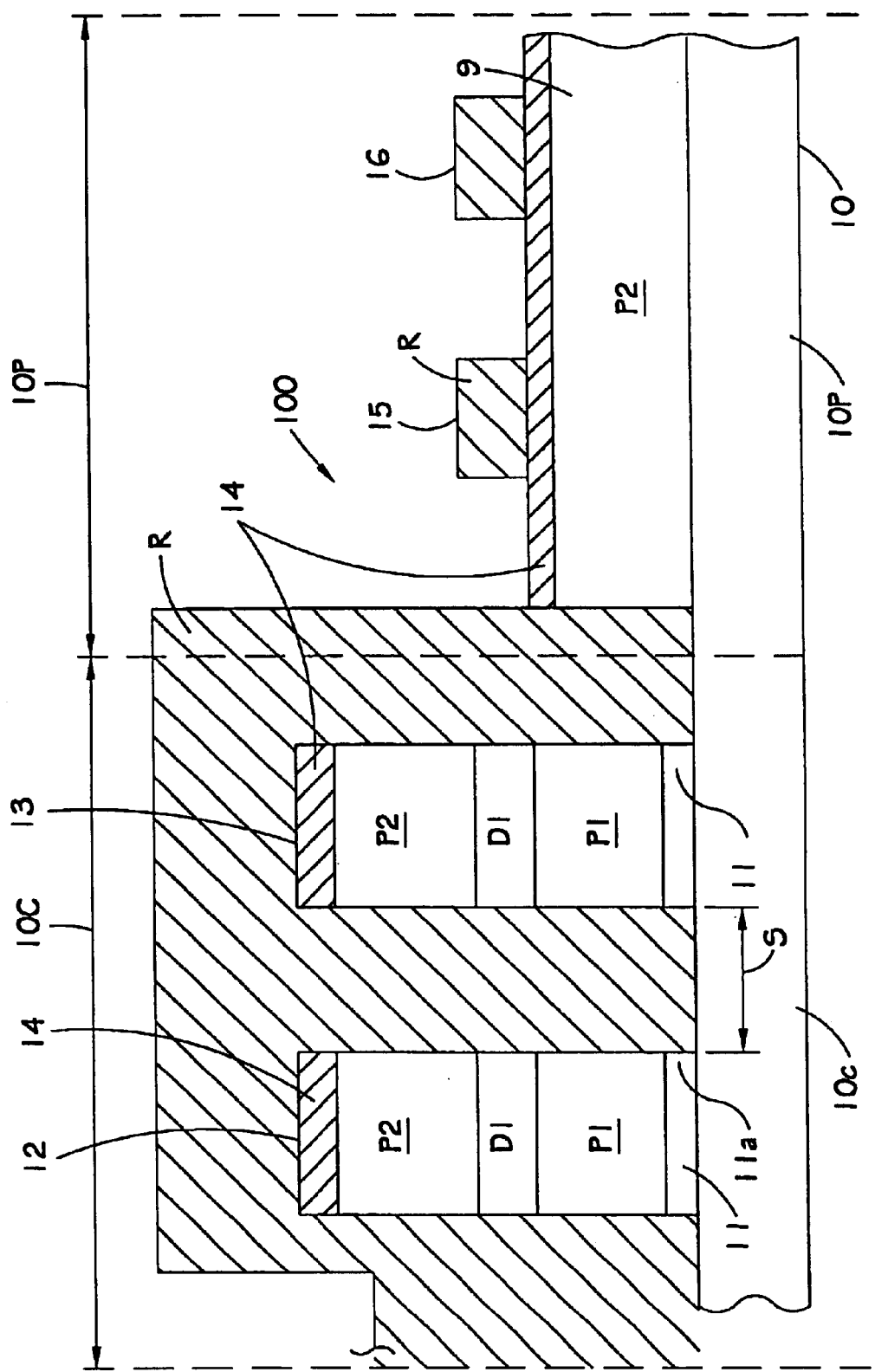
Figure 1.0 (Prior Art)

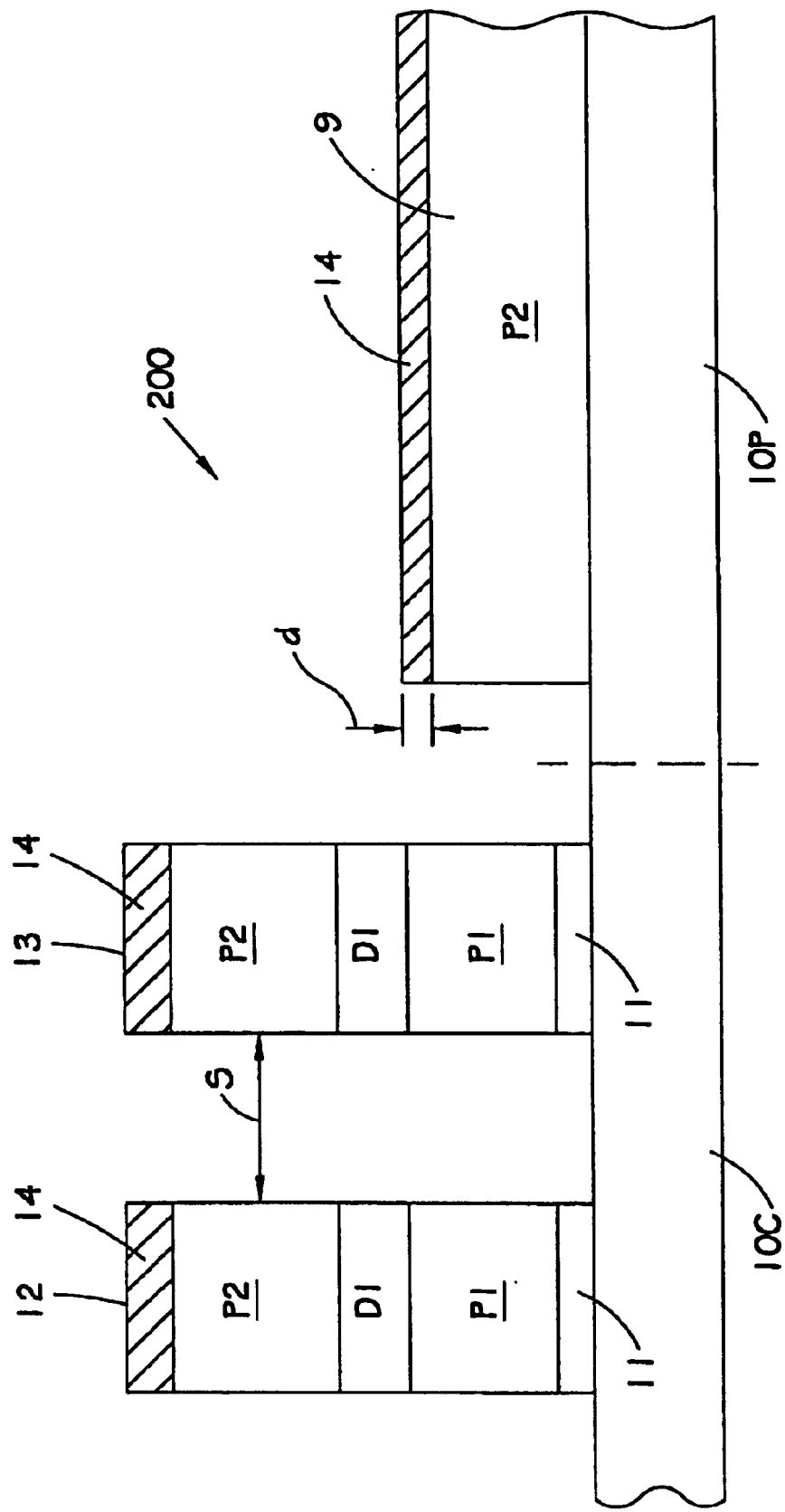
Figure 2.0

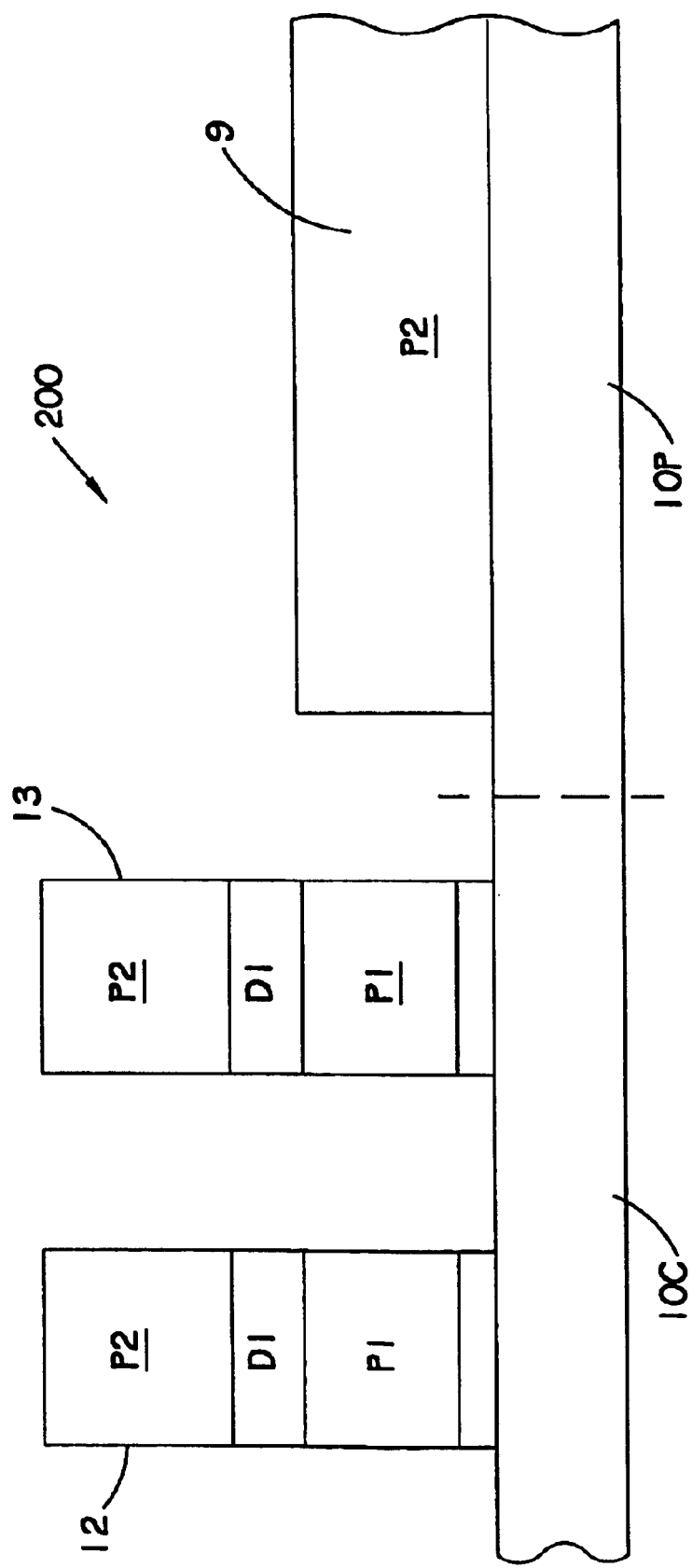
Figure 3.0

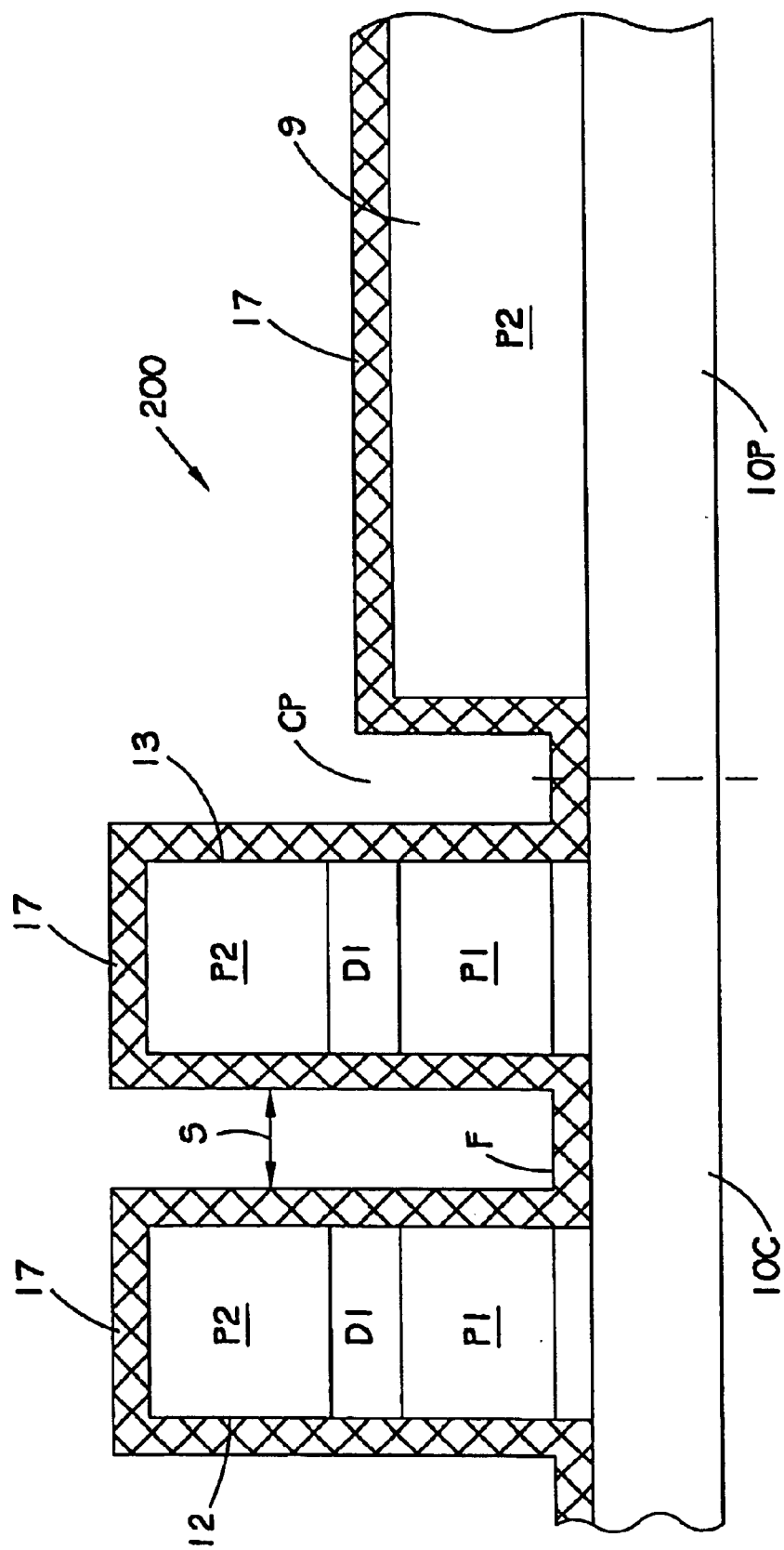
Figure 4.0

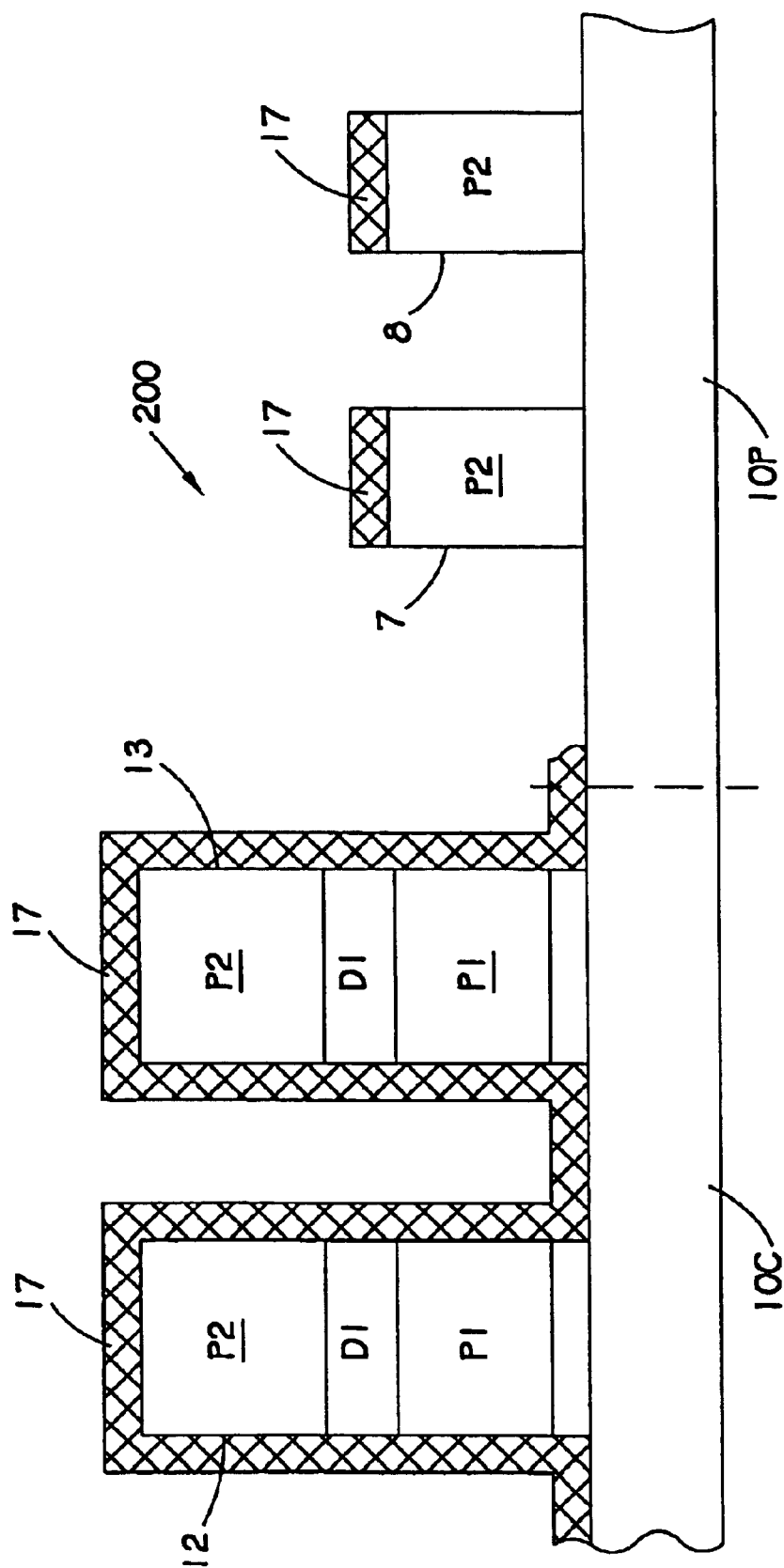
Figure 5.0

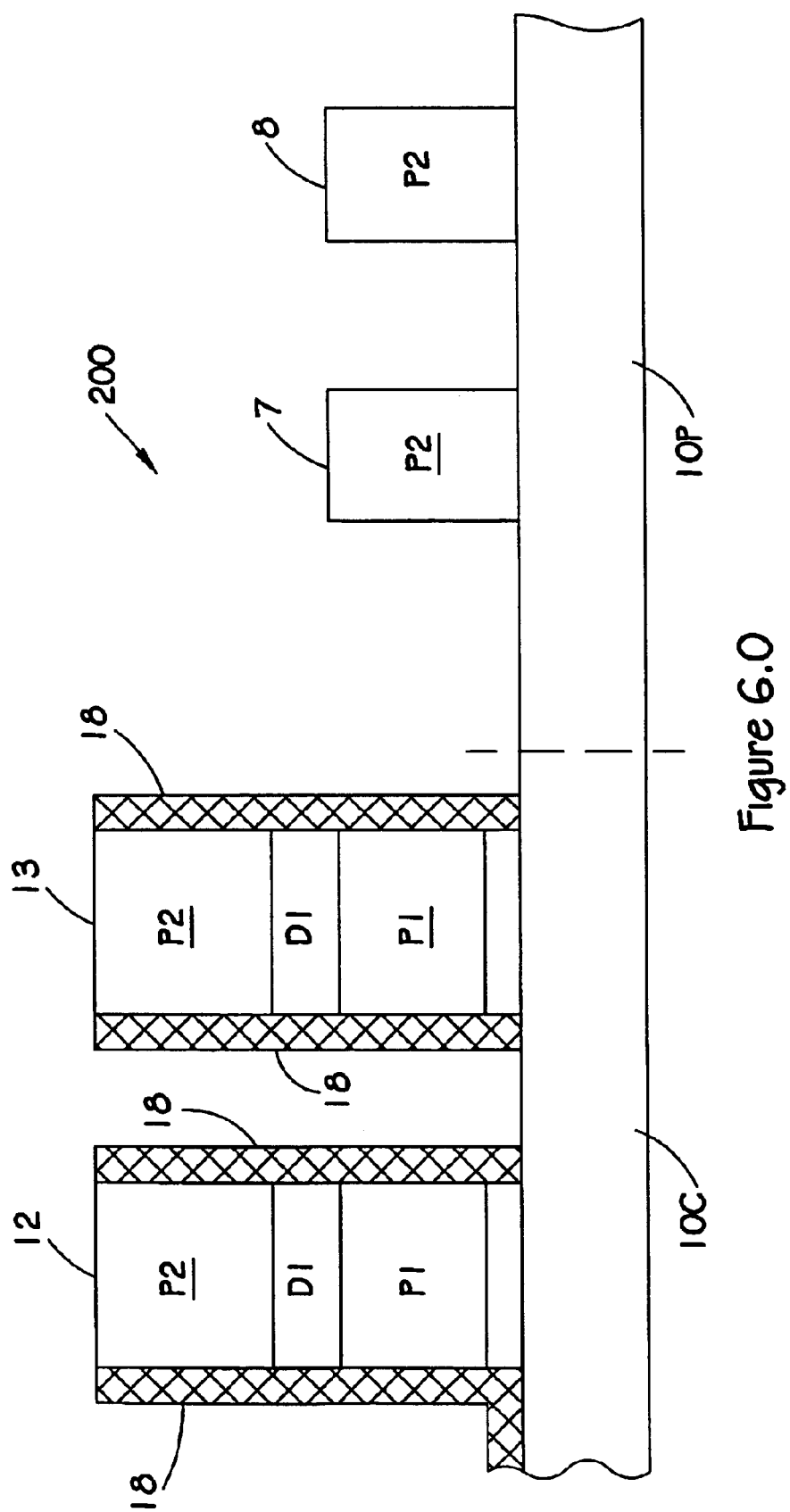
Figure 6.0

US 6,798,002 B1

DUAL-PURPOSE ANTI-REFLECTIVE COATING AND SPACER FOR FLASH MEMORY AND OTHER DUAL GATE TECHNOLOGIES AND METHOD OF FORMING

CROSS-REFERENCE TO RELATED APPLICATION(S)

This application is related to co-pending U.S. Provisional Patent Application Ser. No. 60/159,235, also entitled "DUAL-PURPOSE ANTI-REFLECTIVE COATING AND SPACER FOR FLASH MEMORY AND OTHER DUAL GATE TECHNOLOGIES AND METHOD OF FORMING," filed Oct. 13, 1999.

TECHNICAL FIELD

The present invention relates to integrated semiconductor circuits and anti-reflective coating fabrication techniques used in dual gate semiconductor technology, such as flash memory technology. More particularly, the present invention relates to integrated semiconductor circuits and fabrication techniques for forming sidewall structure on the sidewalls of the transistor gates used in dual gate semiconductor technology, such as flash memory technology. Even more particularly, the present invention relates to integrated semiconductor circuits and fabrication techniques for forming sidewall structure on the sidewalls of transistor gates in the core memory region as used in dual gate semiconductor technology, such as flash memory technology.

BACKGROUND OF THE INVENTION

Dual gate technology, such as flash memory technology, uses anti-reflective coatings to ease lithographic patterning. The closely formed dual gate transistor gates require electrical isolation provided by spacers formed on the sidewall structure of the gate stacks. Typically, a dielectric material, similar to the anti-reflective coating material, is used to form the spacers on the sidewall structure of the dual transistor gates. According to known fabrication techniques, the anti-reflective coating is used twice during formation of the spacers, which, as a result of etching and stripping action of the fabrication process, the thickness of the anti-reflective coating is reduced, resulting in a loss of the effectiveness of the anti-reflective coating. Thus, there is seen to exist a need for a fabrication technique that does not depend on deteriorated use of the anti-reflective coating to fabricate the sidewall spacers of dual gate semiconductor devices.

BRIEF SUMMARY OF THE INVENTION

Accordingly, the present invention provides a dual gate semiconductor device, such as a flash memory semiconductor device, whose plurality of dual gate sidewall spacer structures is not formed from traditional dielectric material similar to the anti-reflective coating material that is traditionally used for lithographic patterning. Rather, the present invention provides a dual gate semiconductor structure whose sidewall spacers are formed by a first and second anti-reflection fabrication process, whereby the sidewall spacers of the dual transistor gate structure in the core memory region arm left coated with the second anti-reflective coating material, such as silicon oxynitride (SiON), silicon nitride ($Si_3N_4$), and insulator silicon germanium (SiGe), or other material having optical properties compatible with subsequent fabrication processing, to form sidewall spacers for use in subsequent implant and salicidation steps, commonly used during fabrication of the semiconductor device being formed. Other features of the present invention are disclosed or are apparent in the section entitled "DETAILED DESCRIPTION OF THE INVENTION."

BRIEF DESCRIPTION OF DRAWINGS

The invention, including its various features and advantages, may be more readily understood with reference to the following detailed description of the best mode for carrying out the invention, taken in conjunction with the accompanying drawings, wherein like reference numerals designate like structural elements, as below-referenced. Reference numbers refer to the same or equivalent parts of the present invention throughout the several figures of the drawings.

FIG. 1 is a cross-sectional view of a prior art semiconductor device shown at a fabrication stage whereby anti-reflective coating portions overlying various memory element regions will be subjected to various etching process steps after patterning.

FIG. 2 is a cross-sectional view of a semiconductor substrate shown at a fabrication stage in accordance with the present invention where a first anti-reflective coating has been utilized for patterning core and periphery substrate regions.

FIG. 3 is a cross-sectional view of the memory semiconductor substrate depicted in FIG. 2 shown with the first coat of anti-reflective coating having been removed.

FIG. 4 is a cross-sectional view of the memory semiconductor substrate depicted in FIG. 3 shown at a fabrication stage where a second anti-reflective coating has been formed over the patterned core and peripheral regions in accordance with the present invention.

FIG. 5 is a cross-sectional view of the memory semiconductor substrate depicted in FIG. 4 shown having patterned peripheral memory regions and core memory regions fully coated with the second anti-reflective coating.

FIG. 6 is a cross-sectional view of the memory semiconductor substrate depicted in FIG. 6 shown having sidewall spacers formed from the second anti-reflective coating in accordance with the present invention.

DETAILED DESCRIPTION OF THE INVENTION

FIG. 1 is a cross-section of a prior art semiconductor substrate 10 shown at an early fabrication stage for forming a flash memory device 100. As depicted, substrate 10 comprises a core region 10C and a periphery region 10P. The core memory stacks 12, 13 and periphery memory region 9 are provided with an anti-reflective coating 14 having a typical thickness d in a range of 300 Å to 1000 Å. Core memory stacks 12, 13, at this stage of fabrication and as depicted in FIG. 1, may comprise a thin layer of silicon dioxide 11, a first polysilicon layer P1, a dielectric layer D1 over layer P1 and a second polysilicon layer P2 over layer D1. The spacing S between stacks 12 and 13 is in the sub-micron range which necessitates the formation of spacers between stacks 12 and 13 to protect the corner regions 11a of the silicon dioxide layers 11 during various etching operations. The peripheral memory region 9 may comprise, as depicted in FIG. 1, a layer of polysilicon material P2 for use in formation of the periphery memory elements. Further, as previously discussed, the prior art processes utilize anti-reflective coatings 14 multiple times, in combination with a photoresist material R, for use in formation of resist patterns, such as resist patterns 15, 16.

FIG. 2 shows a flash memory device 200, in accordance with the present invention, at a fabrication stage where, rather than applying photoresist material to form subsequent other resist patterns, the first anti-reflective coating layers 14 are used only to form the core memory stacks 12, 13 and the peripheral memory region 9.

Accordingly, FIG. 3 shows the device 200 with anti-reflective coating 14, depicted in FIG. 2, stripped from the core memory stacks 12, 13 and the peripheral memory region 9.

FIG. 4 shows the present invention, where, in preparation for subsequent patterning processes, a second coating of anti-reflective coating material 17, such as silicon oxynitride (SiON), silicon nitride ($Si_3N_4$), and insulator silicon germanium (SiGe), or other suitable material with dual purpose optical properties compatible with other fabrication processes, is deposited in a thickness in a range of 300 Å to 1000 Å over the core memory stacks 12, 13, the spacing S between stacks 12, 13, floor region F, the core-periphery interface region CP, and over the periphery memory region 9.

As shown in FIG. 5, the second coating 17 is used for patterning any remaining gate structures, such periphery gate structures 7, 8 in the periphery memory region 9, depicted in FIG. 4, by appropriate masking and etching operations.

FIG. 6 shows the present invention where spacers 18 are defined on the sidewalls of the core memory gate structures 12, 13 after stripping the second anti-reflective coating 17 from over the second polysilicon layers P2 of core memory gate stacks 12, 13, and from over the periphery memory gate structures 7, 8. Accordingly, the present invention provides a dual gate semiconductor structure 200 whose sidewall spacers 18 of core memory gate structures 12, 13 are formed by a first and second and-reflection fabrication process. In accordance with the present invention, the sidewall spacers 18 of the dual transistor gate structure in the core memory region are left coated with the second anti-reflective coating material, such as silicon oxynitride (SiON), silicon nitride ($Si_3N_4$), and insulator silicon germanium (SiGe), or other material having optical properties compatible with subsequent fabrication processing, to form sidewall spacers for use in subsequent implant and salicidation steps, commonly used during fabrication of the semiconductor device.

Information, as herein shown and described in detail, is fully capable of attaining the above-described advantages of the invention, the presently preferred embodiment of the invention, and is, thus, representative of the subject matter which is broadly contemplated by the present invention. The scope of the present invention fully encompasses other embodiments which may become obvious to those skilled in the art, and is to be limited, accordingly, by nothing other than the appended claims, wherein reference to an element in the singular is not intended to mean "one and only one" unless explicitly so stated, but rather "one or more." All structural and functional equivalents to the elements of the above-described preferred embodiment and additional embodiments that are known to those of ordinary skill in the art are hereby expressly incorporated by reference are intended to be encompassed by the present claims.

Moreover, no requirement exists for a device or method to address each and every problem sought to be resolved by the present invention, for such to be encompassed by the present claims. Furthermore, no element, component, or method step in the present disclosure is intended to be dedicated to the public regardless of whether the element, component, or method step is explicitly recited in the claims. However, it should be readily apparent to those of ordinary skill in the art that various changes and modifications in form, semiconductor material, and fabrication material detail may be made without departing from the spirit and scope of the inventions as set forth in the appended claims. No claim herein is to be construed under the provisions of 35 U.S.C. § 112, sixth paragraph, unless the element is expressly recited using the phrase "means for."

What is claimed is:

1. A semiconductor memory device, comprising:
  a. a silicon substrate;
  b. a periphery memory region delineated on said substrate, said periphery memory region having at least one periphery memory element thereon formed;
  c. a core memory region also delineated on said substrate, said core memory region comprising at least one set of dual gate core memory structures thereon formed, said dual gate core memory structures at least one pair of core memory stacks, and
    said core memory stacks comprising:
      a semiconductor material; and
      a dielectric material defining respective sidewall portions;
  d. a sidewall spacer structure comprising an anti-reflective coating material for protecting said core memory stacks during etching operations, said anti-reflective coating material comprising insulator silicon germanium (SiGe); and
  e. a coating residing on said periphery memory region comprising said anti-reflective coating material, wherein said coating is adapted to protect said periphery memory region during etching operations and to provide a pattern for said at least one periphery memory clement on said periphery memory region.

2. A semiconductor memory device, as recited in claim 1, wherein:
  said anti-reflective coating material being selected from an anti-reflective coating material group consisting of silicon oxynitride (SiON), silicon nitride ($Si_3N_4$), and insulator silicon germanium (SiGe), said material group having anti-reflective optical properties and being compatible with ion implantation and salicidation fabrication processes.

3. A semiconductor memory device, as recited in claim 2, wherein:
  said anti-reflective coating material being deposited in a thickness ranging from 300 Å up to 1000 Å and, also being a pattern formation structure for said at least one peripheral memory element.

4. A semiconductor memory device, composing:
  a. a silicon substrate;
  b. a periphery memory region delineated on said substrate, said periphery memory region having at least one periphery memory element thereon formed,
  c. a core memory region also delineated on said substrate, said core memory region having at least one set of dual gate core memory structures thereon formed, said dual gate core memory structures comprising at least one pair of spaced core memory stacks, and
    said core memory stacks comprising:
      a first polysilicon layer,
      a dielectric layer over the first polysilicon layer, and a second polysilicon layer over the dielectric layer;

d. a sidewall spacer structure comprising a anti-reflective coating material for protecting said core memory stacks during etching operations, wherein said anti-reflective coating material comprises a thickness ranging from 300 Å up to 1000 Å (i.e., $\geq$300 Å and <1000 Å); and e. a coating residing on said periphery memory region comprising said anti-reflective coating material, wherein said coating is adapted to protect said periphery memory region during etching operations and to provide a pattern for said at least one periphery memory element on said periphery memory region.

5. A semiconductor memory device, as recited in claim 4, wherein:

said anti-reflective coating material being selected from an anti-reflective coating material group consisting of silicon oxynitride (SiON), silicon nitride ($Si_3N_4$), and insulator silicon germanium (SiGe), said material group having anti-reflective optical properties and being compatible with ion implantation and salicidation fabrication processes.

6. A semiconductor memory device, comprising:

a. a silicon substrate;

b. a periphery memory region delineated on said substrate, said periphery memory region having at least one periphery memory element thereon formed;

c. a core memory region also delineated on said substrate, said core memory region having at least one set of dual gate core memory structures thereon formed,
said dual gate core memory structures comprising at least one par of spaced core memory stacks, and
said core memory stacks comprising:
a first polysilicon layer,
a dielectric layer over the first polysilicon layer, and
a second polysilicon layer over the dielectric layer;

d. a sidewall spacer structure comprising an anti-reflective coating material for protecting said core memory stacks during etching operations,
wherein said anti-reflective coating material comprises insulator silicon germanium (SiGe) being compatible with ion implantation and salicidation fabrication processes, and
wherein said anti-reflective coating material comprises a thickness ranging from 300 Å up to 1000 Å (i.e., $\geq$300 Å and <1000 Å); and e. a coating residing on said periphery memory region comprising said anti-reflective coating material, wherein said coating is adapted to protect periphery memory region during etching operations and to provide a pattern for said at least one periphery memory element on said periphery memory region.

7. A semiconductor memory device, as recited in claim 6, wherein: said anti-reflective coating material being deposited in a thickness ranging from 300 Å to 1000 Å and, also being a pattern formation structure for said at least one peripheral memory element.

8. A semiconductor memory device, comprising:

a. a silicon substrate;

b. a periphery memory region delineated on said substrate, said periphery memory region having at least one periphery memory element thereon formed;

c. a core memory region also delineated on said substrate, said core memory region having at least one set of dual gate core memory structures thereon formed,
said dual gate core memory structures comprising at least one pair of spaced core memory stacks, and
said core memory stacks comprising:
a first polysilicon layer,
a dielectric layer over the first polysilicon layer, and
a second polysilicon layer over the dielectric layer;

d. a sidewall spacer structure comprising an anti-reflective coating material for protecting said core memory stacks during etching operations,
wherein said anti-reflective coating material comprises a material selected from a group consisting of silicon oxynitride (SiON), silicon nitride ($Si_3N_4$), and insulator silicon germanium (SiGe), said group being compatible with ion implantation and salicidation fabrication processes, and
wherein said anti-reflective coating material comprises a thickness ranging from 300 Å up to 1000 Å (i.e., $\geq$300 Å and <1000 Å); and e. a coating residing on said periphery memory region comprising said anti-reflective coating material, wherein said coating is adapted to protect said periphery memory region during etching operations and to provide a pattern for said at least one periphery memory element on said periphery memory region.

* * * * *